US012665370B2

(12) United States Patent
Marzenell et al.

(10) Patent No.: US 12,665,370 B2
(45) Date of Patent: Jun. 23, 2026

(54) 3D LASER DEVICE FOR ULTRASHORT PULSES

(71) Applicant: TRUMPF Schweiz AG, Gruesch (CH)

(72) Inventors: Stefan Marzenell, Malans (CH); Stefan Knupfer, Malans (CH); Christoph Weinert, Gruesch (CH); Thorsten Ulm, Landquart (CH)

(73) Assignee: TRUMPF SCHWEIZ AG, Gruesch (CH)

( * ) Notice: Subject to any disclaimer, the term of this patent is extended or adjusted under 35 U.S.C. 154(b) by 518 days.

(21) Appl. No.: 18/346,911

(22) Filed: Jul. 5, 2023

(65) Prior Publication Data

US 2024/0009765 A1 Jan. 11, 2024

(30) Foreign Application Priority Data

Jul. 11, 2022 (DE) ..................... 10 2022 117 156.6

(51) Int. Cl.
| | |
|---|---|
| *H01S 3/00* | (2006.01) |
| *B23K 26/0622* | (2014.01) |
| *B23K 26/064* | (2014.01) |
| *B23K 26/067* | (2006.01) |
| *B23K 26/082* | (2014.01) |
| *B23K 26/70* | (2014.01) |
| *H01S 3/04* | (2006.01) |
| *H01S 3/23* | (2006.01) |
| *H01S 5/02253* | (2021.01) |

(52) U.S. Cl.
CPC ........ *H01S 3/0071* (2013.01); *B23K 26/0624* (2015.10); *B23K 26/0643* (2013.01); *B23K 26/0648* (2013.01); *B23K 26/067* (2013.01);

*B23K 26/082* (2015.10); *B23K 26/703* (2015.10); *H01S 3/0085* (2013.01); *H01S 3/0407* (2013.01); *H01S 3/2308* (2013.01); *H01S 5/02253* (2021.01)

(58) Field of Classification Search
CPC .... H01S 3/0071; H01S 3/0085; H01S 3/0407; H01S 3/2308; H01S 5/02253; B23K 26/0624; B23K 26/0643; B23K 26/0648; B23K 26/067; B23K 26/082; B23K 26/703

See application file for complete search history.

(56) References Cited

U.S. PATENT DOCUMENTS

| | | | |
|---|---|---|---|
| 4,525,842 A | 6/1985 | Myers | |
| 6,181,463 B1 | 1/2001 | Galvanauskas et al. | |
| 6,198,568 B1 | 3/2001 | Galvanauskas et al. | |
| 2003/0189959 A1 | 10/2003 | Erbert et al. | |

(Continued)

FOREIGN PATENT DOCUMENTS

CN 105390912 A 3/2016

*Primary Examiner* — Yuanda Zhang
(74) *Attorney, Agent, or Firm* — LEYDIG, VOIT & MAYER, LTD.

(57) ABSTRACT

A laser device includes a laser module for generating a laser beam of sub-nanosecond laser pulses with a laser source, and arranged downstream of the laser module in a beam path of the laser beam, a deviating instrument for variable deviation of the laser beam in two spatial directions. The laser device further includes a focusing instrument for variable displacement of a focal point of the laser beam in a third spatial direction that corresponds to a propagation direction of the laser pulses.

10 Claims, 1 Drawing Sheet

(56)          References Cited

U.S. PATENT DOCUMENTS

| | | |
|---|---|---|
| 2004/0213302 A1 | 10/2004 | Fermann et al. |
| 2004/0243111 A1 | 12/2004 | Bendett et al. |
| 2004/0243112 A1 | 12/2004 | Bendett et al. |
| 2005/0226286 A1 | 10/2005 | Liu et al. |
| 2005/0226287 A1 | 10/2005 | Shah et al. |
| 2006/0217688 A1 | 9/2006 | Lai |
| 2015/0311666 A1 | 10/2015 | Fermann et al. |
| 2017/0343831 A1* | 11/2017 | Bakin ................ G02B 27/0012 |
| 2019/0067897 A1 | 2/2019 | Starodoumov et al. |
| 2020/0001393 A1* | 1/2020 | Philippron ........... B23K 26/032 |
| 2020/0119510 A1* | 4/2020 | Stroemberg .......... H01S 3/0623 |

* cited by examiner

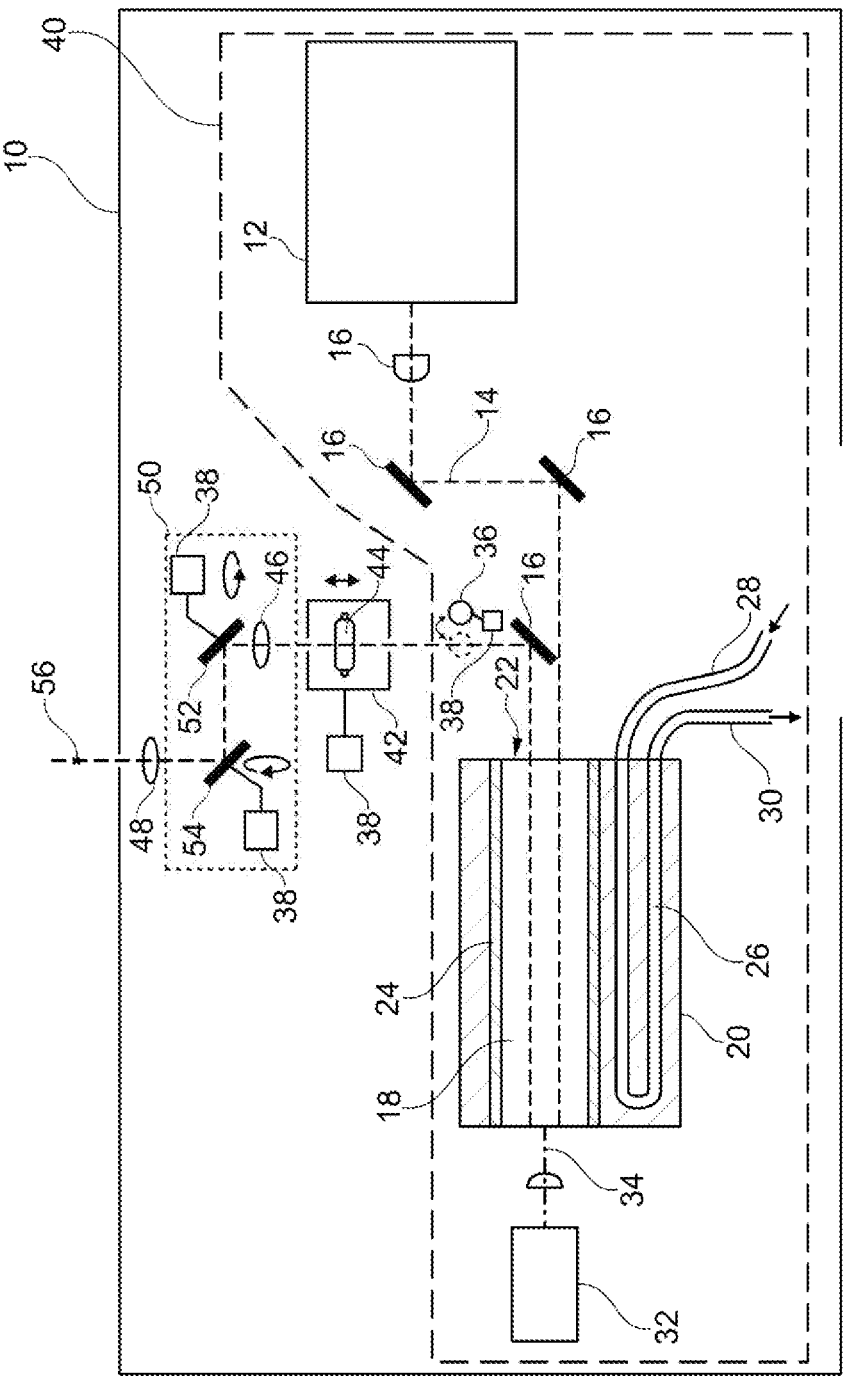

3D LASER DEVICE FOR ULTRASHORT PULSES

CROSS-REFERENCE TO PRIOR APPLICATION

This application claims benefit to German Patent Application No. DE 10 2022 117 156.6, filed on Jul. 11, 2022, which is hereby incorporated by reference herein.

FIELD

Embodiments of the present invention relate to a laser device, which may be used for example for industrial applications.

BACKGROUND

Lasers are currently used in many different fields and applications, for example for the industrial cutting and processing of material. There are in this case various optimisation goals and corresponding challenges. For example, the simplest and most flexible possible use, the highest possible efficiency and effectiveness, the highest possible robustness and a compact design, but also the lowest possible manufacturing and operating costs are sought. Since previous laser systems are not optimal in all these categories and other categories, there is still a need for improvements and further developments.

SUMMARY

Embodiments of the present invention provide a laser device that includes a laser module for generating a laser beam of sub-nanosecond laser pulses with a laser source, and arranged downstream of the laser module in a beam path of the laser beam, a deviating instrument for variable deviation of the laser beam in two spatial directions. The laser device further includes a focusing instrument for variable displacement of a focal point of the laser beam in a third spatial direction that corresponds to a propagation direction of the laser pulses.

BRIEF DESCRIPTION OF THE DRAWINGS

Subject matter of the present disclosure will be described in even greater detail below based on the exemplary FIGURES. All features described and/or illustrated herein can be used alone or combined in different combinations. The features and advantages of various embodiments will become apparent by reading the following detailed description with reference to the attached drawings, which illustrate the following:

FIG. 1 shows a partially schematic block diagram of an ultrashort-pulse laser device having a three-dimensionally displaceable laser focus according to some embodiments.

DETAILED DESCRIPTION

Embodiments of the present invention provide a simple and flexible laser device which can be used as a marking laser or inscription laser.

The laser device according to embodiments of the present invention may for example be configured as a marking or inscription laser. Such lasers are suitable for marking methods, for instance engraving, erosion, annealing, discolouration, foaming, cleaning and/or the like. The laser device according to embodiments of the present invention comprises a laser module for generating sub-nanosecond laser pulses, the laser module comprising at least one laser source. In particular, a solid-state laser, for example an Yb:YAG laser or the like may be used here. Sub-nanosecond laser pulses are laser pulses whose temporal length is less than 1 ns. Such laser pulses may also be referred to here as ultrashort pulses (USP). The laser source, or the laser module, may thus for example be adapted to generate picosecond or femtosecond laser pulses. Widely known means and methods may be used for this.

The laser source, or the laser module, may generate or emit a pulsed laser beam, which may move or propagate along a beam path in the laser device as far as the output or radiation point of the latter. The beam path may in this case for example be or comprise an air gap and/or a light-guiding fibre, or the like. The laser device according to embodiments of the invention furthermore comprises a focusing instrument and a deviating instrument, which are arranged downstream of the laser module, or of the laser source, along this beam path. The focusing instrument is adapted for variable displacement of a focal point—in particular lying outside the laser device—of the laser beam in the propagation direction of the laser pulses, which is referred to here without restriction as the third spatial direction. The deviating instrument is adapted for variable deviation of the laser beam, that is to say of the laser pulses, in the other two spatial directions. These two spatial directions may thus—at least outside the laser device—be perpendicular to the propagation direction of the laser pulses. In particular, the focusing instrument may be arranged between the laser source and the deviating instrument as seen along the beam path. The laser pulses emanating from the laser source may thus initially pass through the focusing instrument and then be deviated according to requirements in the other two directions in the deviating instrument.

The deviating instrument and the focusing instrument may thus be tracked according to a respective control specification. To this end, the laser device may for example comprise corresponding driving or adjusting instruments, in particular electrical or electromagnetic driving or adjusting instruments. The laser device may likewise comprise a corresponding control instrument, or a corresponding control module. This may for example convert a respective user specification into corresponding control signals, in particular for the deviating instrument and the focusing instrument, in order to position and guide the focal point in space according to a respective user specification. To this end, the control instrument, or the control module, may for example comprise a processing instrument, for instance a microchip, microprocessor or microcontroller, and a computer-readable data memory coupled thereto. A corresponding operating program or computer program, which implements a corresponding conversion and can be executed by the processing instrument, may then be stored in this data memory.

The focal point may be a point or region—movable or positionable in space by means of the focusing instrument and the deviating instrument—in which the maximum concentration or intensity of the laser beam, or of the laser pulses, exists or is achieved during operation of the laser device, at least outside the laser device itself.

By the embodiments of the present invention, it is possible to produce a 3D-capable ultrashort-pulse marking laser system which, in particular, may be technically simple and, for example, more economical than alternative solutions. Furthermore, short process times are therefore also made possible.

Ultrashort pulses may for example be advantageous for industrial or even medical applications, for instance in respect of reduced thermal influencing of material in the respective environment of the focal point in comparison with longer laser pulses, the achievable powers, and the like. At the same time, the automatic positionability of the focal point in three spatial directions offers great flexibility in respect of the use of the laser device. In this way, for example, simple and rapid processing even of complexly shaped workpieces and surfaces may be made possible, in particular without the respective workpiece or the laser device itself having to be moved. By the combination proposed here of these properties and the corresponding advantages, efficient, rapid, economical and precise processing of workpieces or materials may be made possible by means of the laser device according to embodiments of the invention.

It should be noted that the modules of the laser device, that is to say in particular the laser module or the aforementioned control module, need not be arranged separately or in their own housings, or the like. Rather, these modules and/or further modules, for instance an optics module, may merely be defined as comprising at least the components or elements respectively mentioned. The latter, like the module itself, may be arranged freely relative to one another according to the individual requirement of a specific laser device according to embodiments of the invention, so long as the aforementioned restrictions or conditions in respect of the beam path are satisfied.

The laser source and/or the laser device may, depending on the configuration, comprise one or more further component parts, such as a resonator or an amplifier, for instance a rod, slab, fibre or disc amplifier and/or an acousto-optical switch.

In one possible configuration according to embodiments of the present invention, the deviating instrument comprises a 2D scanner having at least one scanner mirror for deviating the laser beam, which is arranged in the beam path and can be tilted by a drive. Such a mirror-based 2D scanner may allow simple, low-loss and rapid deviation of the laser beam over a wide angle range.

The 2D scanner may for example comprise a single mirror, which can be tilted about two axes. This may allow a compact and lightweight configuration of the laser device. In order to allow simpler driving of the deviating instrument, however, according to one possible configuration according to embodiments of the present invention the 2D scanner comprises two mirrors arranged successively in the beam path. These two mirrors can be tilted independently of one another about different axes by a respective drive. The two mirrors of the 2D scanner may in particular be tiltable respectively about precisely one axis. This may allow a simple and stable structure of the laser device, as well as simple driving, for example in comparison with a mirror that can be tilted about two axes for combined deviation of the laser beam in both spatial directions.

In another possible configuration according to embodiments of the present invention, the focusing instrument comprises a lens and an adjusting instrument. In this case, the lens is mounted movably for displacement of the focal point, that is to say in particular it may be displaced or moved in the third spatial direction. This lens may therefore also be referred to as a focus displacing lens. The adjusting instrument is adapted here for electromagnetically actuated adjustment, that is to say movement, of the lens. In other words a variable-position lens, which may in particular be magnetically mounted, is thus provided here for varying the focal position. The adjusting instrument may to this end be or comprise an electromechanical assembly having a magnet, a plunger coil and a restoring spring. This may allow simple, rapid and reliable adjustment, or movement, of the lens. Rapid focus tracking of this type may allow shorter process times, for instance in comparison with conventional workpiece tracking with a mechanical z axis or one that can be adjusted or actuated by means of a conventional electric motor. The electromagnetic actuation provided here, in particular the magnetic bearing of the focus displacing lens with a plunger coil, may make it possible that the progression of the focal point along a surface to be processed, or in the plane that can be scanned by the deviating instrument, is not braked by the focus tracking, that is to say the displacement of the focal point along the z axis, i.e. in the third spatial direction, as may often be the case in conventional laser systems.

The focusing instrument proposed here may thus be configured as a so-called fast z axis, or may comprise a so-called fast z axis assembly. In this way, the focal point can be positioned and moved rapidly in space. This in turn may also allow correspondingly rapid and precise material processing even of complexly shaped workpieces or surfaces. Furthermore, the positionability and movability of the focal point in three spatial directions may thus be achieved technically more simply and more economically than, for example, a solution with a so-called f-theta objective. The z axis may correspond in a predetermined coordinate system to the third spatial direction.

The focusing instrument may, for example, be or comprise a telescope in which the focus adjusting lens is configured as a diverging lens, which is applied in a fast movable z axis. The focusing instrument, or the laser device, may also be equipped with a third lens as a focusing lens for focusing onto a surface respectively to be processed or a workpiece respectively to be processed. The focal length of this third lens may be configured to be modifiable for various individual laser devices and/or for various applications, for instance in order to specify or select the focal diameter in a certain range. Alternatively, conventional f-theta plane field optics may also be used for this focusing, although they usually comprise elaborate lens packages and may therefore be more elaborate and more expensive. Overall, the variable focusing instrument provided here may thus comprise a lens system.

When using a simple focusing lens—for instance instead of f-theta plane field optics or a corresponding elaborate lens package—undesired plane field distortions may conventionally occur. With the fast z axis provided in the present case, on the other hand, it is possible to rectify such plane field distortions though the focus tracking by means of the movable lens of the focusing instrument. In this way, a simple—and therefore correspondingly more economical—single focusing lens may be used without loss of quality.

The focusing instrument may also be adapted to compensate for lens, optics or imaging errors of one or more lenses of the laser device, that is to say for example of the focus displacing lens, of the focusing lens, of a collimator lens and/or of a mirror setting, or the like. To this end, for example, the adjusting instrument may vary or take into account a corresponding offset, for example according to a detected or computationally determined lens or optics error, when adjusting or moving the focus displacing lens. In this way, a simple focusing lens may be used without impairment in the focusing instrument, which may allow simpler and more economical—for instance in comparison with a plurality of lenses and/or further optical elements—production of the laser device. In addition or alternatively, for example, the or a lens of the focusing instrument may be tilted as a function of a respectively detected or predetermined or measured lens, optics or imaging error in order to compensate for this (astigmatism compensation). Thus, for example, the position and quality of the focal point may therefore be optimised even in the event of corresponding errors or in the event of corresponding changes in the course of the lifetime of the laser device.

In another possible configuration according to embodiments of the present invention, the laser device comprises an amplifier, which is configured as a rod amplifier. In other words, the amplifier may thus be or comprise a rod-shaped element through which the laser beam can pass, and the laser beam can thereby receive or gain energy. Such an element may for example be a crystal rod, for instance of doped yttrium aluminium garnet (YAG), or the like. The rod amplifier may thus be arranged in the beam path of the laser beam. In addition, the laser device or the amplifier may have a pump energy source by means of which energy can be pumped, that is to say introduced, into the rod-shaped element, this energy then being available for amplification of the laser beam. Such a pump energy source may for example be or comprise a diode module or a lamp, or the like, which is arranged in order to shine light or radiation into the rod-shaped element. The configuration according to embodiments of the present invention may allow a robust and compact structure of the laser device and therefore simple handling.

In another possible configuration according to embodiments of the present invention, the rod amplifier is arranged for input of the laser beam into the rod amplifier and output of the laser beam from the rod amplifier through an end side of the rod amplifier, that is to say of the rod-shaped element or crystal. The input and output of the laser beam may in this case take place in particular through the same end side. Thus, the laser beam may then pass through the rod amplifier twice in opposite directions. A heat sink is arranged along the lateral face, which extends in the longitudinal direction of the rod amplifier, or of the rod-shaped element, between the end sides and perpendicularly thereto. This heat sink may, for example, be configured as a metal block or the like. The rod amplifier may, in particular, be at least partially embedded or incorporated into the heat sink. By the configuration according to embodiments of the present invention as proposed here, large-area cooling and therefore uniform thermal regulation of the rod amplifier may be achieved. This may lead or contribute to robust, reliable and consistently stable behaviour of the rod amplifier and therefore also of the laser device overall. The heat sink may in this case also function as a general heat sink in the laser device, for example by means of thermal radiation or thermally conductive connection of one or more other component parts of the laser device to the heat sink. The pump light source already mentioned elsewhere for coupling energy into the rod amplifier, or the rod-shaped element thereof, may be arranged in such a way that it likewise shines or couples light or energy in through the or an end side of the rod amplifier. In this way, the large-area and uniform thermal regulation of the rod amplifier may be sustained by means of the heat sink along the lateral face.

In another possible configuration according to embodiments of the present invention, the rod amplifier, that is to say the rod-shaped element through which the laser beam passes for amplification during operation, is thermally joined to the heat sink with solder material. In addition or alternatively, a coolant can flow through the heat sink. To this end, the heat sink may for example comprise one or more cooling channels. By these measures, a further improved cooling performance may be achieved by means of the heat sink, and therefore even better stability of the laser device. This may furthermore be achieved substantially without additional space requirement, that is to say without increasing the size of the heat sink, so that material and costs may correspondingly be saved.

In another possible configuration according to embodiments of the present invention, the laser source is configured to generate or emit laser light with a wavelength in the near infrared, or the near infrared range. The laser source may thus, for example, emit laser light, or laser radiation, in the wavelength range of between 780 nm and 3000 nm, that is to say for example at about 1030 nm. Such wavelengths may be used effectively for the processing of various materials, in particular for metal processing. Furthermore, such wavelengths can be generated simply and economically and handled with conventional means, that is to say for example deviated with conventional laser mirrors and focused or diverged with conventional lenses. This therefore allows correspondingly economical production of the laser device.

In another possible configuration according to embodiments of the present invention, the laser module comprises a frequency conversion element, which can be introduced into the beam path and removed from the beam path. Thus, a variation of the output wavelength, which can be switched on and off selectively or according to requirements, of the laser source may therefore be achieved. Here, one or more such frequency conversion elements may be provided as required, and/or the frequency conversion element may be designed to generate at least one harmonic of the wavelength of the incident laser light. Different wavelengths may therefore correspondingly be generated or adjusted flexibly. For example, an SHG (second harmonic generation) element and a THG (third harmonic generation) element may be used. In particular, the frequency conversion element may be configured as a frequency doubling element. When using a laser source that emits laser light with a wavelength of 1030 nm, for example, laser light with a wavelength of 515 nm may be generated therefrom by introducing the frequency conversion element—configured here in particular as a frequency doubling element—into the beam path. Correspondingly shorter wavelengths may allow better or more accurate focusing, that is to say a smaller focal point and therefore correspondingly more precise material processing. The wavelength switchability proposed here may allow efficient processing of a large number of different materials that differ in their wavelength-dependent absorption behaviour. Thus, simple, rapid and economical processing may therefore be made possible for different materials with only a single laser device, in particular with only a single laser source.

The frequency conversion element may for example automatically, that is to say by means of a corresponding drive or a corresponding controller, be pivoted into the beam path and pivoted out of the beam path, or correspondingly displaced or tilted. This may, for example, be carried out by being instigated by means of a corresponding control element of the laser device, or instigated by the reception of a corresponding control signal by the laser device.

In another possible configuration according to embodiments of the present invention, the laser device also comprises an external acousto-optical modulator (XAOM) and a grating compressor. The XAOM allows linearisation and multilevel stabilisation of the output power of the laser device. By means of the grating compressor, ultrashort pulses may be generated simply, reliably and stably by compressing longer laser pulses. The configuration according to embodiments of the present invention as proposed here therefore offers a practical way in which the laser device according to embodiments of the invention may be produced with advantageous properties.

Marking lasers or inscription lasers may for example be used in a variety of ways in industry and technology. The combination of ultrashort laser pulses having a duration of less than 1 ns with 3D positionability of the laser focus may be useful in this case. In this regard, FIG. 1 shows a partially schematic representation of a laser device 10. This laser device 10 is configured here as a 3D USP marking laser. The laser device 10 to this end comprises a laser source 12, which may also be referred to as a seed laser. The laser source 12 generates a laser beam 14, shown here along the beam path in the laser device 10. The laser beam 14 may be shaped and steered by various optical elements 16 in the laser device 10. These optical elements 16 may for example comprise one or more lenses, for instance a collimator lens, one or more mirrors and/or the like.

The laser device 10 furthermore comprises a rod amplifier 18. This rod amplifier 18 may, for example, be or comprise an Yb:YAG rod. In practical use, this may for example have a diameter in the range of 3 mm and a length in the range of from 8 mm to 10 mm. Depending on the application, other sizes may however also be possible. Although not shown in detail here, the rod amplifier 18 may for example be provided with an antireflection coating in order to reduce losses of laser energy by scattering.

The rod amplifier 18 is embedded in a heat sink 20, an end side 22 of the rod amplifier 18 being at least partially exposed. For better thermal coupling, for example, solder or another thermally conductive material may be arranged between the rod amplifier 18 and the heat sink 20. For effective and efficient cooling, a cooling channel 26—indicated only schematically here—extends through the heat sink 20. A coolant, which is supplied via an inlet 28 and is discharged via an outlet 30, for example from and to a reservoir, an external radiator (not represented here), a coolant pump and/or the like, may flow through this cooling channel.

The laser beam 14 can enter the rod amplifier 18 through the end face 22, travel through it in the incidence direction and the opposite direction, and then re-emerge from the rod amplifier 18 through the same end face 22. The laser beam 14 can thereby gain energy.

This energy may be coupled into the rod amplifier 18 in the form of pump light 34 by a pump light source 32, for example likewise through the end face 22 or, as provided here, through an opposite side from the end face 22. The latter may allow simpler arrangement of the aforementioned component parts. For further optimisation of the input of the pump light 34 or its propagation direction in the rod amplifier 18, at least one optical element, in particular a lens, may be arranged between the pump light source 32 and the rod amplifier 18.

The laser source 12 may generate laser light with a particular wavelength. This may, however, be variable in its frequency if required. To this end, for example, a frequency conversion element 36 can be pivoted into the beam path of the laser beam 14 and pivoted out of the beam path as required, for instance by means of a corresponding driving instrument 38. The frequency conversion element 36 is arranged here by way of example downstream of the rod amplifier 18, although it may likewise be arranged at a different position along the beam path.

The component parts described so far, in particular the laser source 12 and the rod amplifier 18, may be combined or understood as a laser module 40.

The laser device 10 also comprises further component parts for 3D focus positioning, which are arranged downstream of the laser module 40 along the beam path of the laser beam 14. To this end a focusing instrument 42 is provided, which here comprises a lens system with three lenses. A first of these lenses of the focusing instrument 42 is a variable lens, which is referred to as the focus displacing lens 44 and is mounted magnetically or electromagnetically movably in a fast z axis direction in the beam direction of the laser beam 14—referred to here as the third spatial direction. The focus displacing lens 44 may thus be displaced directly by means of a magnetic, correspondingly controlled magnetic field. A collimator lens 46 is arranged downstream in the beam path as the second lens of the focusing instrument 42. A focusing lens 48 as the third lens of the focusing instrument 42 is in turn arranged downstream of the collimator lens 46 in the beam path. This focusing lens 48 is arranged here by way of example on the output side, that is to say before an output or an emission point of the laser device 10.

A 2D scanner 50 as a deviating instrument for deviating the laser beam 14 in the other two spatial directions, that is to say in particular perpendicularly to the beam direction, is furthermore provided for the 3D focus positioning. To this end, the 2D scanner 50 here comprises a first scanner mirror 52 and a second scanner mirror 54. These scanner mirrors 52, 54 can be tilted by means of a respective driving instrument 38, in each case about one axis but a different axis. A 2D processing field may thereby be scanned with the laser beam 14. The first scanner mirror 52 and the second scanner mirror 54 are arranged between the collimator lens 46 and the output-side focusing lens 48, as seen along the beam path of the laser beam 14.

By means of the focusing instrument 42, the focus displacing lens 44 may be moved, that is to say displaced, for example by means of a corresponding electromagnetic driving instrument 38, in order to displace a focal point 56 of the laser beam 14 in the third spatial direction, that is to say perpendicularly to the 2D processing field. By corresponding control of the laser device 10, or of the driving instruments 38, the focal point 56 may thus be positioned and moved freely in a three-dimensional processing field.

The 2D scanner 50, or the focusing instrument 42, may be adapted to tilt or displace the laser beam 14 or the focal point 56 with a speed of—depending on the focal length or the working field—for example from 10 m/s to 20 m/s. Thus, the focal point 56 may therefore be tracked correspondingly rapidly, for example along a three-dimensional surface, or material or workpiece contour, to be processed.

The laser device 10 may comprise further components or component parts, for example a grating compressor, a resonator that is external to the laser source 12, a control module, a current supply or voltage supply, terminals, interfaces, control elements and/or the like.

Overall, the described examples show a way in which a 3D USP marking laser may be produced in a simple and economical way.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCES 10 laser device
12 laser source
14 laser beam
16 optical elements
18 rod amplifier
20 heat sink
22 end side
24 solder
26 cooling channel
28 feed
30 discharge
32 pump light source
34 pump light
36 frequency conversion element
38 driving instrument
40 laser module
42 focusing instrument
44 focus displacing lens
46 collimator lens
48 focusing lens
50 2D scanner
52 first scanner mirror
54 second scanner mirror
56 focal point

The invention claimed is:

1. A laser device, comprising:
a laser module for generating a laser beam of sub-nanosecond laser pulses with a laser source,
arranged downstream of the laser module in a beam path of the laser beam, a deviating instrument for variable deviation of the laser beam in two spatial directions, and
a focusing instrument for variable displacement of a focal point of the laser beam in a third spatial direction that corresponds to a propagation direction of the laser pulses, wherein the focusing instrument comprises a first lens, a second lens, and a third lens disposed sequentially along the beam path, the first lens being a focus displacing lens and disposed upstream from the deviating instrument, the second lens being a collimating lens and disposed upstream from the deviating instrument, and the third lens being a focusing lens and disposed downstream from the deviating instrument.

2. The laser device according to claim 1,
wherein
the deviating instrument comprises a 2D scanner having at least one scanner mirror for deviating the laser beam, wherein the at least one scanner mirror is arranged in the beam path and is capable of being tilted by a drive.

3. The laser device according to claim 2,
wherein
the 2D scanner comprises a first scanner mirror and a second scanner mirror disposed downstream from the first scanner mirror in the beam path, wherein the first scanner mirror and the second scanner mirror are capable of being tilted independently of one another about different axes by a respective drive.

4. The laser device according to claim 1,
wherein
the focusing instrument comprises an adjusting instrument, the adjusting instrument being adapted for electromagnetically actuated adjustment of the first lens.

5. The laser device according to claim 1,
further comprising:
an amplifier configured as a rod amplifier.

6. The laser device according to claim 5,
wherein
the rod amplifier is arranged for input and output of the laser beam through an end side of the rod amplifier, and a heat sink is arranged along a lateral face of the rod amplifier.

7. The laser device according to claim 6,
wherein
the rod amplifier is thermally joined to the heat sink with solder, and/or the heat sink is configured to allow a coolant to flow therethrough.

8. The laser device according to claim 1,
wherein
the laser source is configured to emit laser light with a wavelength in a near infrared range.

9. The laser device according to claim 8,
wherein
the laser module comprises a frequency conversion element that is capable of being introduced into the beam path and removed from the beam path.

10. The laser device according to claim 1,
further comprising:
an external acousto-optical modulator and a grating compressor.

* * * * *